NEGATIVE-RESISTANCE SEMICONDUCTOR DEVICE FOR HIGH FREQUENCIES

Filed Nov. 16, 1967 2 Sheets-Sheet 1

United States Patent Office 3,493,823
Patented Feb. 3, 1970

3,493,823

NEGATIVE-RESISTANCE SEMICONDUCTOR DEVICE FOR HIGH FREQUENCIES

Junichi Nishizawa and Tokuzo Sukegawa, Miyagi-ken, Japan, assignors to Zaidan Hojin Handotai Kenkyu Shinkokai Kawauchi, Miyagi-ken, Japan, a Japanese foundation Filed Nov. 16, 1967, Ser. No. 683,569
Claims priority, application Japan, Nov. 19, 1966, 41/76,076
Int. Cl. H01l 3/00, 5/00
U.S. Cl. 317—234 10 Claims

ABSTRACT OF THE DISCLOSURE

The effective thickness of a depletion layer at the junction of a semiconductor structure is caused to vary thereby to accomplish injection of a majority carrier which enters and exits from a part of the structure for transit of the injected carrier, and the semiconductor structure is thus caused to have negative resistance. An accelerating electric field for the injected carrier is established by appropriately selecting the impurity concentration distribution.

The resulting semiconductor device is highly suitable for generation, amplification, and modulation of microwaves and ultrasonic waves.

This invention relates to solid state electronic devices used in the field of electrical communications and more particularly to a new negative-resistance semiconductor device for high frequencies which is useful for oscillation, amplification, and modulation relating to microwaves and ultrasonic waves.

Among the carrier injection methods practised heretofore in negative-resistance semiconductor devices in which transition time is used, there have been those wherein the so-called "avalanche" and the so-called "tunnel effect" in the p-n junction are respectively utilized. The method wherein injection is accomplished by an avalanche is subject to a limitation whereby the applied bias voltage necessary for occurrence of the avalanche must be greater than a specific value as, for example greater than 10 volts in the case of silicon and greater than 6 volts in the case of germanium. On the other hand, by the method wherein the tunnel effect is utilized, it is necessary to use a high concentration of added impurities in order to attain a thin depletion layer, whereby the conductivity modulation effect is disadvantageously small.

It is an object of the present invention to overcome these and related problems.

More specifically, an object of the invention is to provide a semiconductor device having excellent negative-resistance characteristics in the ultrasonic region.

Another object of the invention is to provide a negative-resistance semiconductor device for high frequencies which is highly suitable for generation, amplification, and modulation of microwaves.

Still another object of the invention is to provide a negative-resistance semiconductor device for high frequencies which is highly suitable for generation, amplification, and modulation of ultrasonic waves.

According to the present invention, briefly summarized, there is provided a negative-resistance semiconductor device for high frequencies characterized in that the charging and discharging of a space charge due to variation of the effective thickness of a depletion layer existing at a junction of the semiconductor structure of the device are utilized to accomplish injection of a majority carrier. In the semiconductor structure, at least one junction is formed and is selected from junctions of the p-n, n-n, and p-p types, heterosemiconductor junctions, and metal-semiconductor junctions.

The nature, principle, details, and utility of the invention will be more clearly apparent from the following detailed description with respect to the principle of the invention and preferred embodiments thereof when read in conjunction with the accompanying drawings, in which like parts are designated by like reference numerals and characters.

In the drawings:

FIGS. 1*a*, 1*b* and 1*c* are schematic diagrams explaining the principle of the invention;

FIGS. 2*a*, 2*b*, 3*a*, 3*b*, 4*a*, 4*b*, 5*a*, 5*b* and 8 are similar diagrams illustrating examples of preferred embodiment of the invention;

Figure 1:
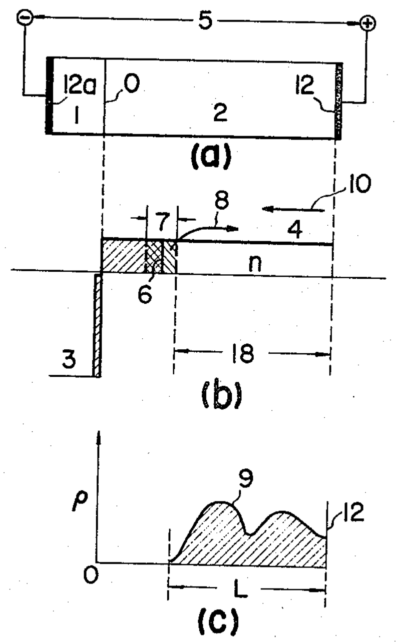

Referring to FIGS. 1*a* and 1*b* showing one example of a semiconductor device indicating the principle of the invention, a p-n junction is formed by a p-type region 1 and an n-type region 2 with an interface O therebetween. The acceptor and donor density distributions are respectively designated by reference numerals 3 and 4. Ohmic contacts 12 and 12*a* are provided at the positions shown.

When a D-C bias voltage 5 is applied in the reverse direction of the junction, the depletion layer expands up to position 6. When an alternating current is applied in a superimposed manner with respect to this voltage 5, the depletion layer depth varies by distance 7 as indicated in FIG. 1(*b*), and, in accordance with the exiting and entering at this part of the majority carrier, carrier injection 8 is accomplished into the n-type region on the outer side of the depletion layer.

The injection carrier thus injected is conveyed by a drift action due to an electric field 10 and becomes a wave of condensation and rarefaction as indicated in FIG. 1(*c*). In FIG. 1(*c*), character $\rho$ indicates the carrier density. The time lag for the injected carrier to reach the ohmic contact position 12, that is, the transit time, produces the negative resistance. The condition for obtaining negative resistance may be expressed by the following equation in terms of the carrier drift velocity $v$, angular frequency $\omega$ of the alternating current, and the thickness L of the part remaining when the depletion layer is removed from the region 2, that is, the thickness of part 18.

$$(2m+1)\pi<\frac{\omega L}{v}<2\pi(m+1)$$

where $m=0, \pm 1, \pm 2, \pm 3, \ldots$.

While the D-C, electric field 10 applied to the n-type region causes the conditions to be such that the wave of condensation and rarefaction 9 assumes values suitable for drift, a particularly effective practice is to cause the D-C electric field 10 to be amply greater than the A-C electric field due to the curve 9 or to be of a value such that the drift velocity becomes saturated, whereby the modulation effect due to the injection 8 on the drift velocity can be neglected.

From the above consideration, it will be apparent that the current flowing through the depletion layer is advanced in phase by $\pi/2$ relative to the voltage applied to the junction, whereby the depletion layer capacitance accomplishes an important function with respect to the phase rotation of the entire device of the invention. Thus, a unique feature of the present invention is that the expanding effect of the depletion layer contributes to both the injection of the carrier and the phase rotation.

The principle of the present invention as described above can be utilized in various applications. For example, since a wave of condensation and rarefaction of the carrier can be easily obtained by the injection method according to the invention, generation and amplification of ultrasonic waves can be readily accomplished by using semiconductors having piezoelectric effect as, for example, GaAs, InAs, InSb, GaP, InP, ZnSe, and ZnTe. It is possible, furthermore, to obtain further benefit by additionally utilizing also the piezoelectric effect of the depletion layer itself.

In order to indicate still more fully the nature and utility of the invention, the following examples of embodiments thereof are set forth, it being understood that these examples are presented as illustrative only and that they are not intended to limit the scope of the invention.

EXAMPLE 1

Figure 2:
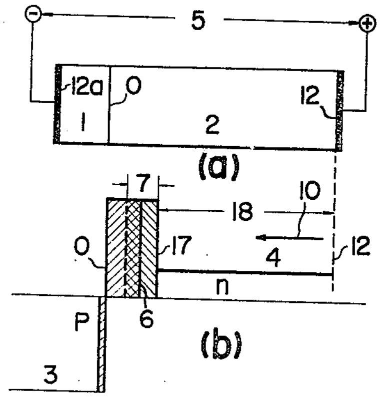

In the practice of the invention, an organization of the semiconductor device as illustrated in FIG. 2*a* wherein the impurity density is so arranged that the additional impurity density is relatively high from the interface to the part 17, where the depletion layer expansion is a maximum, and the impurity density of the part outside thereof, in which the injected carrier is caused to travel, i.e., part 18, is low, is extremely effective. This organization has the following two advantageous features.

The first feature is that, since the impurity density within the variation range of the depletion layer thickness is relatively high, the space charge variation becomes large even when the variation of the depletion layer thickness due to voltage variation is slight. Accordingly, it is possible to raise greatly the injection efficiency of the majority carrier.

The second feature is that, by causing the impurity density in part 18 to be low, the modulation efficiency of electrical conductivity due to the injected carrier is elevated, and, moreover, the D-C bias voltage 5 is easily applied to this part, whereby an accelerating electric field 10 is readily realized.

One example of method of regulating the magnitude of the accelerating electric field 10 is as follows. The magnitude of this electric field 10 is obviously determined by the voltage applied to the part 18. On the other hand, the applied bias voltage 5 is applied in a divided state to the junction part and the part 18 wherein the carrier is caused to travel. Accordingly, by providing the junction with a leakage resistance of suitable value and appropriately dividing the voltage 5 by means of this leakage resistance and the D-C resistance of part 18, it is possible to control the accelerating electric field 10.

The leakage resistance of the junction can be produced by methods such as, for example: increasing the defects in the semiconductor crystal in the vicinity of the junction; adding to the junction at least one impurity having a deep level such as O, Au, Ag, Cu, Fe, Ni, Cr, and Co; and surrounding the junction region with an oxidizing or reducing atmosphere. The leakage resistance can be obtained, of course, by other methods such as maintaining a flow of current so that a tunnel effect or an avalanche effect occurs in a suitable manner.

EXAMPLE 2

Figure 3:
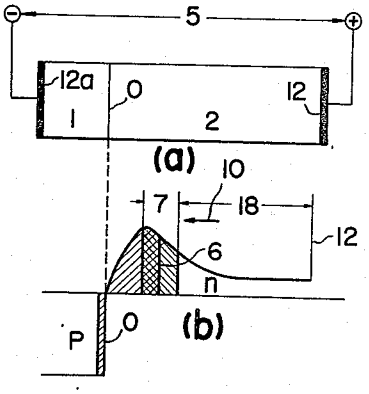

In a second example of practice of the invention as illustrated in FIGS. 3*a* and 3*b*, an accelerating electric field 10 is established by providing the impurity distribution in part 18 with a concentration gradient. In obtaining this field 10, it is possible, of course, to make additional use of a voltage applied from the outside.

An impurity distribution as indicated in FIG. 3*b* according to the invention can be established by any of several methods, examples of which are as follows: the so-called alloying-after-diffusion process which comprises diffusing in a semiconductor material an impurity of the same conductivity as the impurity already added to the material, thereafter causing the material to contain an impurity of opposite conductivity, and alloying the resulting alloy material to form a p-n junction; the alloying-diffusion process, in which alloying and diffusion are carried out simultaneously through the use of an alloy material containing two kinds of impurities respectively to become acceptor and donor impurities; the double diffusion process; the grown junction process, in which impurities are appropriately added during crystal growing to obtain a desired impurity concentration distribution; the melt-back process; and the epitaxial process. In addition to these, of course, other production techniques may be used. A specific example of procedure for producing a semiconductor device as illustrated in FIGS. 3*a* and 3*b*, is as follows.

EXAMPLE 3

A p-type wafer of GaAs of an impurity concentration of from $10^{13}$ to $10^{17}$ atoms/cubic centimeter is prepared as a substrate. A crystal is grown on this substrate in a manner such that the grown layer will be of n-type by a process in which GaAs or GaP as starting materials are dissolved in a solvent comprising Ga containing either Sn or Te, or both and Zn. The Zn contained in the grown layer is caused to diffuse appropriately in the substrate by heat treating the materials during or after the growth of the crystal. A semiconductor device according to the invention as shown in FIGS. 3*a* and 3*b* is thereby produced.

In an actual instance of practice, a p-type GaAs substrate of a thickness of 450 microns and an impurity concentration of $2\times10^{16}$ atoms per cubic centimeter was prepared. This substrate was covered with a solution prepared by dissolving to saturation GaAs at 850 degrees C. in a solvent metal consisting of an alloy of 200 mg. of Sn, 10 mg. of Zn, and 3 grams of Ga. Then, by cooling the substrate thus covered, a grown layer of a thickness of approximately 30 microns and added quantities of Zn and Sn of approximately $10^{17}$ and $10^{18}$ atoms/cubic centimeter, respectively, was formed. The device thus formed was then heat treated for 3 hours at 850 degrees C. in a hydrogen atmosphere, whereupon a semiconductor device which oscillated at approximately 50 mc. was obtained.

EXAMPLE 4

On a p-type Si base wafer of a thickness of 400 microns and an effective impurity density of $10^{16}$ atoms/cc., a dot consisting of an alloy of Ag, Pb, Sb, and Al in a proportion by weight of 112:92:52:1, respectively, was attached. The materials thus assembled were then subjected to heat treatment for 20 minutes at 950 degrees C. to effect simultaneously alloying and diffusion. An oscillation of 15 mc. was obtained by using the resulting device.

In the process of this example, an impurity concentration in the base of from $10^{13}$ to $10^{17}$ atoms/cc. produces satisfactory results. Furthermore, this process can be practiced with dots of compositions other than that set forth above provided that they contain Al and Sb.

EXAMPLE 5

Figure 8:
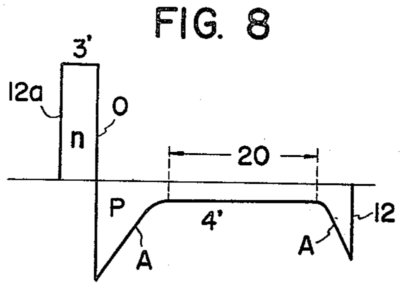

By preparing a p-type GaAs or GaP substrate of an impurity concentration of from $10^{13}$ to $10^{17}$ atoms/cc., diffusing Zn therein to establish an impurity distribution such as to produce a p-type layer of high concentration, and then depositing Sn by evaporation on the surface thereby to accomplish alloying and form a p-n junction, it is possible to produce a device as indicated in FIG. 8. In FIG. 8, the parts designated by reference numeral 19 indicate the impurity distribution due to the diffusion of Zn, and numeral 20 designates a part determined by the concentration of the impurity added previously to the substrate. A specific example of actual practice of this process is set forth below.

First, an n-type GaAs wafer to which Zn had been added with a concentration of $2\times10^{16}$ atoms/cc. was prepared. The surface on one side of this wafer was lapped with No. 3,000 carborundum, and the other surface was polished (mirror finished) to an accurately plane surface with $Al_2O_3$ of a grain size of 0.3-micron diameter. The wafer was then placed, together with Zn and As, in a quartz ampule, which was then sealed and evacuated to a vacuum of approximately $2.5\times10^{-6}$ mm. Hg, and zinc diffusion was carried out for 5 hours at a temperature of 850 degrees C. The As was used for the purpose of preventing decomposition of the GaAs during the diffusion heat treatment.

The thickness of the GaAs wafer was approximately 300 microns. Sn was deposited by evaporation on the diffused surface on the side which had been mirror finished with $Al_2O_3$ thereby to form a p-n junction thereon. Indium was deposited by evaporation on the opposite surface, i. e., the surface on the side which had been lapped with carborundum, thereby to form an ohmic contact. The wafer was then heated and alloyed for 5 minutes in a vacuum at a temperature of 500 degrees C. A square piece measuring 1 x 1 mm. was cut out of the wafer by means of an ultrasonic cutter, and a semiconductor device having an impurity concentration distribution as indicated in FIG. 8 was produced.

When this device was cooled to a liquid nitrogen temperature, and a D-C bias voltage of 20 volts was impressed thereon in the direction opposite that of the junction, an oscillation of approximately 30 mc. was obtained, and, furthermore, the emission of ultrasonic waves was also detected. The current flowing at this time was 50 ma.

EXAMPLE 6

Figure 4:
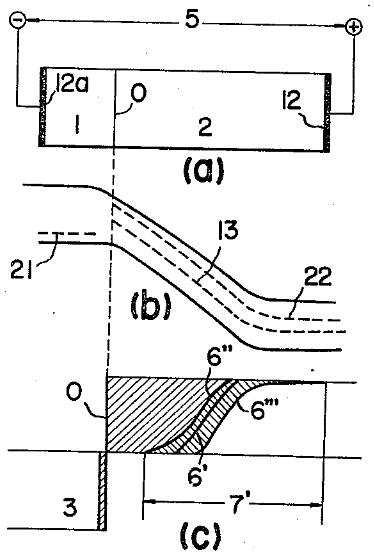

FIG. 4 illustrates an example of a device which has a part 2, to which an impurity having a deep level 13 as, for example, Au, Ag, Cu, Fe, Ni, Cr, and Co, has been added. In this case, the deep-level impurity gives rise to a considerable downward slope to the space-charge distribution at the edge part of the depletion layer as indicated by curve 6'. Then with voltage variation, charging and discharging of the space charge occur between curves 6'' and 6'''.

Accordingly, the region, in which injection occurs, is distributed over a wide range as indicated by 7', whereby the effect of injection is increased. In other words, since the region of injection can be used simultaneously for the drift space, the entire device can be made thin, and high frequency operation can be readily accomplished.

The number of this impurity level, of course, is not limited to one but may be two or more. In FIG. 4(*b*), reference numerals 21 and 22 respectively designate acceptor and donor levels.

EXAMPLE 7

Figure 5:
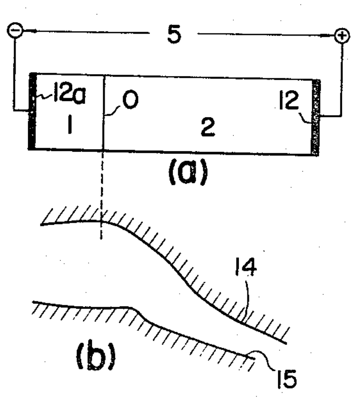

In another example of a semiconductor device as illustrated in FIG. 5, the injection efficiency is further elevated, and, moreover, in order to establish readily an accelerating electric field 10, a heterojunction and the device of the invention are used in conjunction. The width of the effective forbidden band of the p-type region 1 is made greater than the width of the effective forbidden band of the n-type region 2. Furthermore, the width of the effective forbidden band is caused to decrease with the distance from the interface O of the p-n junction. In FIG. 5(*b*), reference numerals 14 and 15 respectively designate a conduction band and a valence band.

In the practice of the invention, the forbidden band width of the semiconductor is caused to vary with position by forming a crystal consisting of a solid solution of two or more kinds of semiconductor material and varying the composition thereof with position so as to produce the desired forbidden band width. For example, in the case wherein $In_xGa_{1-x}As$ is used, any desired forbidden band width between the forbidden band widths of InAs and GaAs can be obtained by varying the proportions of the In and Ga with position. Furthermore, it is possible, of course, to effect integration within the same solid structure with a part having another function.

The semiconductor device according to the present invention can be formed from at least one semiconductor material selected from a great variety of semiconductor materials, examples of which are Ge, Si, SiC, GaAs, GaSb, GaP, InSb, InAs, InP, PbTe, PbSe, CdSe, CdS, and eutectic mixtures of at least two of these materials.

While the invention has been described above with respect to particular examples of specific organization, the invention can be practiced with various other organizations. For example, it will be apparent that the invention can be practiced by reversing the conductivities of the semiconductor parts in each of the devices illustrated in FIGS. 1 through 5, inclusive. It is also possible to combine appropriately the principles indicated in FIGS. 1 through 5, inclusive, in combinations as, for example, tunnel-effect-injection, avalanche-injection, and pn-junction-injection.

Figure 6:
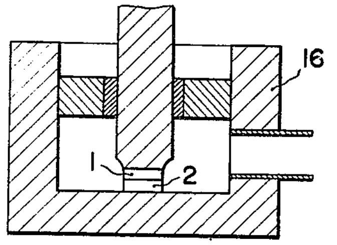
FIG. 6 is a sectional view illustrating one example of application of the semiconductor device of the invention.
Figure 7:
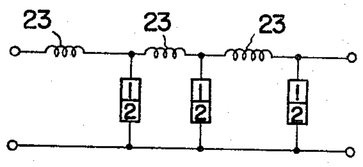
FIG. 7 is a schematic diagram showing another example of application of the device.

The semiconductor device of the invention can be used independently or in conjunction with other electronic devices. For example, the device can be installed in a cavity 16 for microwaves, as shown in FIG. 6 or it may be used in an arrangement such as a fully-distributed arrangement of constant K type, induction M type, or periodic type compensated by inductances 23 as shown in FIG. 7.

Figure 9:
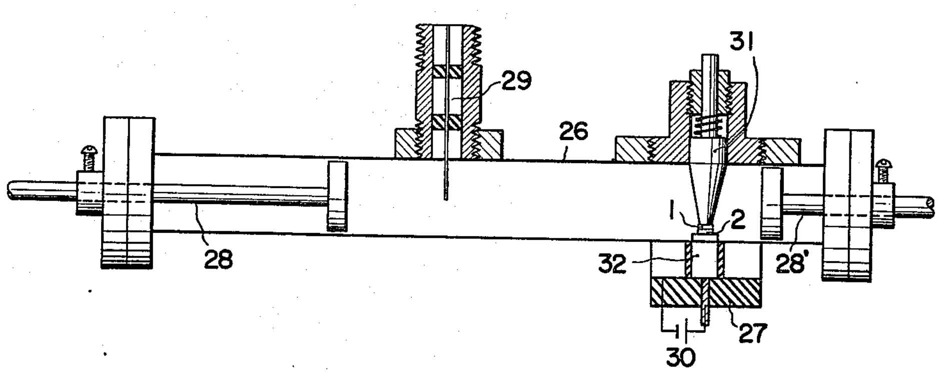
FIG. 9 is an elevational view, partly in vertical section, showing one example of application of the device of the invention in a waveguide resonator.

In a specific example of application of the device of the invention as shown in FIG. 9, the device 1, 2 was held fixed within a waveguide resonator 26 having a waveguide of 12 x 23 mm. section area and 250 mm. length. The waveguide was provided therewithin with opposed shorting plungers 28 and 28'.

For the semiconductor device 1, 2, an alloy composed of 2 grams of Ga, 0.4 gram of GaAs, and 100 mg. of Zn was used on a GaAs substrate doped with $6\times10^{16}$ atoms/cc. of Te. The device was made by forming a p-type grown layer of a thickness of approximately 100 microns by the known solution growth process, reducing by lapping the thicknesses of the layers on the substrate side and the grown layer side respectively to 50 microns, obtaining a square device measuring 400 x 150 microns by cleavage, and forming ohmic contact on the device by a known technique.

The device 1, 2 thus made was placed in the waveguide and on a conductor 32 insulated by an insulator 27 and disposed at the lower part of the waveguide, the device 1, 2 being held in place by a conductor 31 projecting downward from the upper part of the waveguide.

When a bias voltage of 6.5 volts was supplied to the device 1, 2 from a D–C power source 30, and the plungers 28' and 28 were respectively positioned at distances of $\lambda/4$ and $$\frac{\lambda}{4}(2n+1)$$

(where $n$ is an integer) from the device, an oscillation of a frequency of 22 gc. and a voltage of approximately 30 mv. was detected by means of a detection probe 29.

Thus, the present invention provides a negative-resistance semiconductor device for high-frequencies characterized in that the charging and discharging of space charge due to variations in the effective thickness of the depletion layer existing in the junction of a semiconductor structure are utilized to accomplish injection of a majority impurity.

While the invention has been described above with respect to particular examples thereof in each of which a p-n junction is used, the invention is applicable with similar effectiveness also to semiconductor devices having other two-layer junctions, such as a p-p junction, an n-n junction, a metal-semiconductor junction, a hetero-junction, and a p-i-n junction, as well as to multilayer junctions.

Furthermore, by suitably selecting the impurity concentration, organization, and other features in the design of the semiconductor device of the device, the invention can be applied to a wide range of uses.

Accordingly, it should be understood that the foregoing description relates to only preferred embodiments of the invention and that it is intended to cover all changes and modifications of the examples of the invention herein chosen for the purposes of the disclosure, which do not constitute departures from the spirit and scope of the invention as set forth in the appended claims.

What we claim is:

1. A negative-resistance semiconductor device for high frequencies comprising: a semiconductor element having a first region of one conductivity type, a second region of an opposite conductivity type, at least one junction formed at an interface therebetween and at least one depletion layer for transit therethrough of an injected carrier, means providing an impurity concentration at a portion in said first semiconductor region extending from said junction interface to the maximum expansion limit of said depletion layer higher than an impurity concentration at another portion in said first region extending from the limit of said depletion layer up to the extreme end of said first region; electrodes provided at the respective regions of said semiconductor element; and a direct current source and an alternating current source connected to respective electrodes, means for injecting a majority carrier into said depletion layer through utilization of charging and discharging of a space charge, in said first region of said semiconductor element, due to variation in the effective depth of said depletion layer existing at said junction.

2. A negative-resistance semiconductor device according to claim 1, wherein distribution of the impurity concentration in one of said conductivity type region decreases with increasing distance from said interface toward the extreme end of said region opposite to said junction.

3. A negative-resistance semiconductor device according to claim 1, wherein said semiconductor element comprises at least one element selected from group consisting of Ge, Si, SiC, GaAs, GaSb, GaP, InSb, InAs, InP, PbTe, PbSe, CdSe, CdS, and eutectic mixtures of at least two thereof.

4. A negative-resistance semiconductor device according to claim 1, in which said semiconductor element comprises at least one impurity having a deep level selected from a group consisting of O, Au, Ag, Cu, Fe, Ni, Cr, and Co.

5. A negative-resistance semiconductor device according to claim 1, in which said junction formed between the different conductivity type regions comprises a p,n-junction.

6. A negative-resistance semiconductor device according to claim 1, in which said junction formed between the different conductivity type regions comprises a p,i,n-junction.

7. A negative-resistance semiconductor device according to claim 1, in which said junction formed between the different conductivity type regions comprises a metal semiconductor junction.

8. A negative-resistance semiconductor device according to claim 1, in which said junction formed between the different conductivity type regions comprises a multi-layer-junction.

9. A negative-resistance semiconductor device for high frequencies comprising: a semiconductor element having a first region of one conductivity type, a second region of a similar conductivity type, a p,p-junction formed at an interface therebetween and at least one depletion layer for transit therethrough of an injected carrier, means providing an impurity concentration at a portion in said first semiconductor region extending from said junction interface to the maximum expansion limit of said depletion layer higher than an impurity concentration at another portion in said first region extending from the limit of said depletion layer up to the extreme end of said first region; electrodes provided at the respective regions of said semiconductor element; and a direct current source and an alternating current source connected to respective electrodes, means for injecting a majority carrier into said depletion layer through utilization of charging and discharging of a space charge, in said first region of said semiconductor element, due to variation in the effective depth of said depletion layer existing at said junction.

10. A negative-resistance semiconductor device for high frequencies comprising: a semiconductor element having a first region of one conductivity type, a second region of similar conductivity type, an n,n-junction formed at an interface therebetween and at least one depletion layer for transit therethrough of an injected carrier, means providing an impurity concentration at a portion in said first semiconductor region extending from said junction interface to the maximum expansion limit of said depletion layer higher than an impurity concentration to another portion in said first region extending from the limit of said depletion layer up to the extreme end of said first region; electrodes provided at the respective regions of said semiconductor element; and a direct current source and an alternating current source connected to respective electrodes, means for injecting a majority carrier into said depletion layer through utilization of charging and discharging of a space charge, in said first region of said semiconductor element, due to variation in the effective depth of said depletion layer existing at said junction.

References Cited

UNITED STATES PATENTS

| | | | |
|---|---|---|---|
| 3,158,754 | 11/1964 | Yu | 307—88.5 |
| 3,183,359 | 5/1965 | White | 250—199 |
| 3,244,566 | 4/1966 | Mann et al. | 148—186 |
| 3,249,764 | 5/1966 | Holonyak | 307—88.5 |
| 3,267,294 | 8/1966 | Dumke et al. | 307—88.5 |
| 3,283,160 | 11/1966 | Levitt et al. | 250—213 |
| 3,335,337 | 8/1967 | Kasugai et al. | 317—234 |
| 3,366,819 | 1/1968 | Crowder et al. | 313—108 |
| 3,385,981 | 5/1968 | Mayer et al. | 307—299 |

JAMES D. KALLAM, Primary Examiner

U.S. Cl. X.R.

317—237